United States Patent
Yu et al.

(10) Patent No.: US 8,395,540 B2
(45) Date of Patent: Mar. 12, 2013

(54) ANALOG TO DIGITAL CONVERTER

(75) Inventors: Qi-Long Yu, Shenzhen (CN); Jun Zhang, Shenzhen (CN); Tsung-Jen Chuang, New Taipei (TW); Shih-Fang Wong, New Taipei (TW)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 70 days.

(21) Appl. No.: 13/213,099

(22) Filed: Aug. 19, 2011

(65) Prior Publication Data

US 2012/0218136 A1 Aug. 30, 2012

(30) Foreign Application Priority Data

Feb. 25, 2011 (CN) .......................... 2011 1 0046267

(51) Int. Cl.
*H03M 1/56* (2006.01)
(52) U.S. Cl. ........................................ 341/169; 341/155
(58) Field of Classification Search .................. 341/155, 341/169, 166, 140, 128; 327/14; 324/676, 324/76.18
See application file for complete search history.

(56) References Cited

U.S. PATENT DOCUMENTS

| | | | |
|---|---|---|---|
| 4,195,283 A * | 3/1980 | Ishikawa | 341/118 |
| 4,268,820 A * | 5/1981 | Hareyama | 341/168 |
| 5,184,128 A * | 2/1993 | Snow | 341/128 |
| 5,939,902 A * | 8/1999 | Iwata | 327/14 |
| 7,956,778 B2 * | 6/2011 | Koyama | 341/131 |
| 2003/0193324 A1* | 10/2003 | Male | 324/76.18 |
| 2010/0102831 A1* | 4/2010 | Kuang | 324/676 |

* cited by examiner

*Primary Examiner* — Peguy Jean Pierre
(74) *Attorney, Agent, or Firm* — Altis Law Group, Inc.

(57) ABSTRACT

An ADC includes an analog signal input port for receiving analog signals, a reference voltage generation circuit for producing a reference voltage, a controllable switch, a control unit including a counter, an integral circuit, and a comparison circuit. The control unit outputs an on or off signal to turn on or turn off the controllable switch, the counter starts to count when the control unit outputs the off signal. The integral circuit executes an integral action to integrate the reference voltage and output a voltage enhanced gradually when the controllable switch is turned off. The comparison circuit outputs an interrupt signal to cause the counter to stop counting when comparing the voltage output by the integral circuit is higher than the voltage of the analog signals. The control unit determines a digital value corresponding to the analog signals according to a count value of counted by the counter.

8 Claims, 2 Drawing Sheets

ANALOG TO DIGITAL CONVERTER

BACKGROUND

1. Technical Field

The present disclosure relates to analog to digital converters.

2. Description of Related Art

Generally, ADCs (Analog to Digital Converters) are categorized into double integrals type ADCs and single integral type ADCs, the double integrals type ADCs have many advantages over the single integral type ADCs, such as high anti-interference ability, high conversion accuracy. However, because the double integrals type ADCs need to integrate twice, they usually have relative lower conversion rate than the single integral type ADCs.

Therefore, it is desirable to provide an analog to digital converter to overcome the described limitations.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail, with reference to the accompanying drawings.

Figure 1:
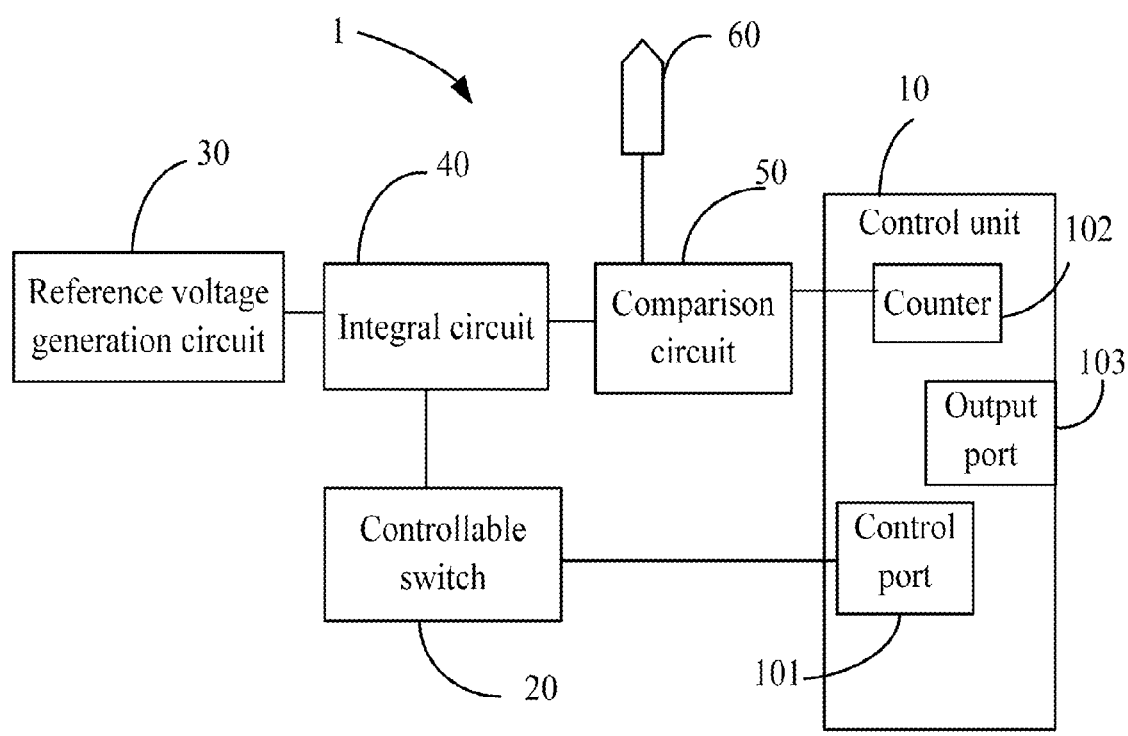
FIG. 1 is a block diagram of an analog to digital converter, in accordance with an exemplary embodiment.

Referring to FIG. 1, an ADC includes a control unit 10, a controllable switch 20, a reference voltage generation circuit 30, an integral circuit 40, a comparison circuit 50, and an analog signal input port 60.

The analog signal input port 60 is used to receive analog signals. The control unit 10 includes a control port 101 and a counter 102. The control unit 10 is connected to the controllable switch 20 via the control port 101, and outputs an on signal or an off signal to turn on or turn off the controllable switch 20 via the control port 101. The counter 102 starts to count when the control unit 10 outputs the off signal. The reference voltage generation circuit 30 is used to produce a reference voltage. The integral circuit 40 enters a ready state when the controllable switch 20 is turned on, and starts to execute an integral action when the controllable switch 20 is turned off.

When the integral circuit 40 executes the integral action, the integral circuit 40 integrates the reference voltage and outputs a voltage which is enhanced gradually based on the reference voltage. The comparison circuit 50 is used to compare the voltage output by the integral circuit 40 with the voltage of the analog signals received by the analog signal input port 60. Then outputs an interrupt signal to the counter 102 at the moment that the voltage being output by the integral circuit 40 increases over the voltage of the analog signals. The counter 102 stops counting when receiving the interrupt signal. The control unit 10 determines a digital value corresponding to the analog signals according to a count value counted by the counter 102. The control unit 10 also includes a digital value output port 103 for outputting the digital value to follow-up circuits (not shown).

Figure 2:
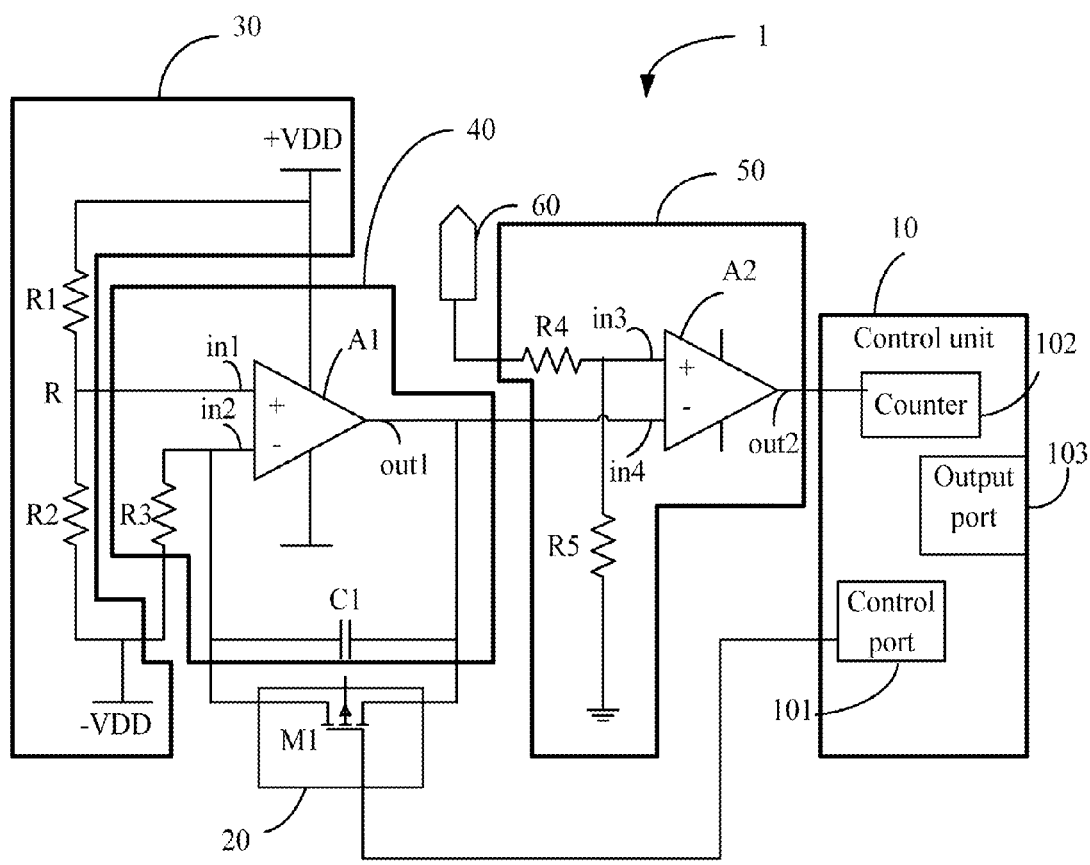
FIG. 2 is a circuit diagram of the analog to digital converter of FIG. 1, in accordance with an exemplary embodiment.

Referring to FIG. 2, in the embodiment, the reference voltage generation circuit 30 includes an anode terminal +VDD, a cathode terminal −VDD, and resistors R1, R2. The anode terminal +VDD is used for providing positive voltage +Vdd, and the cathode terminal −VDD is used for providing negative voltage −Vdd. The resistors R1 and R2 are connected between the anode terminal +VDD and the cathode terminal −VDD in series, a connection point between the resistors R1 and R2 constitutes a reference voltage port R of the reference voltage generation circuit 30. The voltage of the reference voltage port R is the reference voltage produced by the reference voltage generation circuit 30. Supposing that the reference voltage is Vref, it is easily known, the reference voltage Vref output by the reference voltage port R is Vdd*(R2−R1)/(R1+R2). In the embodiment, the resistance value of the resistor R1 is much greater than that of the resistor R2, therefore, the reference voltage Vref is approximately equal to the negative voltage −Vdd provided by the cathode terminal −VDD and higher than the negative voltage −Vdd.

The integral circuit 40 includes an operational amplifier A1, a resistor R3, and a capacitor C1. The operational amplifier A1 includes a non-inverting input port in1, an inverting input port in2, and an output port out1. The non-inverting input port in1 is connected to the reference voltage port R, the inverting input port in2 is connected to the cathode terminal −VDD via the resistor R3, and the inverting input port in2 is also connected to the output port out1 via the capacitor C1.

The comparison circuit 50 includes a comparator A2 and resistors R4 and R5. The comparator A2 includes a non-inverting input port in3, an inverting input port in4, and an output port out2. The resistors R4 and R5 are connected between the analog signal input port 60 and the ground in series. The non-inverting input port in3 is connected to a connection port (not labeled) of the resistors R4 and R5. The inverting input port in4 is connected to the output port out1 of the operational amplifier A1. The resistors R4 and R5 are used to divide the voltage of the analog signals received by the analog signal input port 60. Supposing that the voltage of the analog signals is Va, the voltage of the non-inverting input port in3 is R5*Va/(R4+R5).

The controllable switch 20 and the capacitor C1 is connected in parallel between the inverting input port in2 and the output port out1 of the operational amplifier A1. In the embodiment, the controllable switch 20 is an NMOSFET M1, a gate of the NMOSFET M1 is connected to the control port 101 of the control unit 10. A drain of the NMOSFET M1 is connected to the inverting input port in2 of the operational amplifier A1, and a source of the NMOSFET M1 is connected to the output port out1 of the operational amplifier A1 and the inverting input port in4 of the comparator A2. In other embodiment, the controllable switch 20 can be an NPN BJT.

As is known, the voltage of the inverting input port in2 is equal to the non-inverting input port in1 according to the characteristic of the operational amplifier A1, because the non-inverting input port in1 is connected to the reference voltage port R and obtain the reference voltage Vref. Accordingly, the voltage of the inverting input port in2 is equal to the reference voltage Vref. When the control unit 10 outputs a high voltage to turn on the NMOSFET M1, the capacitor C1 is discharged quickly via the turned on NMOSFET M1, therefore, the voltage of the two ends (not labeled) of the capacitor C1 are equal to each other, the integral circuit 40 enters the ready state. Then the voltage of the output port out1 of the operational amplifier A1 and the inverting input port in4 of the comparator A2 are equal to the voltage of the inverting input port in2, which is equal to the reference voltage Vref.

When the control unit 10 outputs a low voltage to turn off the NMOSFET M1, because the reference voltage Vref is higher than the voltage −Vdd provided by the cathode terminal −VDD, there is current flows from the inverting input port in2 to the cathode terminal −VDD and charges the capacitor C1. The end of the capacitor C1 connected to the inverting input port in2 of the operational amplifier A1 accumulates more and more electrons, then the voltage of the output port out1 and the inverting input port in4 increases over the voltage of the inverting input port in2. Because the voltage of the inverting input port in2 maintains at the reference voltage Vref, the voltage of the output port out and the inverting input port in4 increases over the reference voltage Vref.

At the moment that the voltage of the output port out1 and the inverting input port in4 are increased over the voltage of the non-inverting input port in3 of the comparator A2, the comparator A2 outputs a low voltage interrupt signal to the counter 102 of the control unit 10. As described above, the counter 102 stops counting when receiving the interrupt signal, the control unit 10 determines the digital value corresponding to the analog signals received by the analog signal input port 60 according to the count value.

For better understanding of the present disclosure, the relationship between the digital value and the analog signals is described in detail as follow. As described above, at the moment that the inverting input port in4 increases over the voltage of the non-inverting input port in3 of the comparator A2, the comparator A2 outputs the low voltage interrupt signal to the counter 102 of the control unit 10, and the counter 102 stops counting. Supposing that the count cycle of the counter 102 is T and the count value is AD, then the time the counter 102 starts to count to the time the counter 102 stops counting is T*AD. The integral time of the integral circuit 40 and the charge time of the capacitor C1 is also t=T*AD. It is also easily known, the voltage of the inverting input port in4 is equal to the reference voltage Vref plus the voltage of the capacitor C1.

Supposing that the voltage of the capacitor C1 is Uc, the capacitance value of the capacitor C1 is C, and the quantity of charges is Q, then Uc=Q*C. Supposing that the current flows through the resistor R3 is I=(Vref+Vdd)/R3, then Q=I*t=t*(Vref+Vdd)/R3. Therefore, when the counter 102 stops counting, the voltage of the inverting input port in4 of the comparator A2 is Vref+T*AD *(Vref+Vdd)/R3, which can be considered as being equal to the voltage of the non-inverting input port in3 of the comparator A2. As described above, the voltage of the non-inverting input port in3 of the comparator A2 is equal to R5*Va/(R4+R5), therefore, an equation is established: Vref+T*AD *(Vref+Vdd)/R3=R5*Va/(R4+R5), therefore, it is easily to get a formula Va=(R4+R5)*Vref/R5+T*AD *(Vref+Vdd)* (R4+R5)/R3*R5. Then the control unit 10 determines the digital value corresponding to the voltage Va of the analog signals according to the count value and the formula.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. An analog to digital converter comprising:
an analog signal input port, configured for receiving analog signals;
a reference voltage generation circuit, configured for producing a reference voltage;
a controllable switch;
a control unit comprising a control port and a counter, wherein, the control unit is connected to the controllable switch via the control port, and outputs an on signal or off signal to turn on or turn off the controllable switch via the control port, the counter starts to count when the control unit outputs the off signal;
an integral circuit, configured for entering a ready state when the controllable switch is turned on, and executing integral action to integrate the reference voltage and output a voltage enhanced gradually when the controllable switch is turned off;
a comparison circuit, configured for comparing the voltage outputted by the integral circuit with the voltage of the analog signals received by the analog signal input port, and outputting an interrupt signal to the counter of the control unit at the moment the voltage outputted by the integral circuit is higher than the voltage of the analog signals;
wherein, the counter stops counting when receiving the interrupt signal, the control unit determines a digital value corresponding to the analog signals according to a count value counted by the counter.

2. The analog to digital converter according to claim 1, wherein the reference voltage generation circuit comprises an anode terminal, a cathode terminal, and a first resistor and a second resistor which are connected between the anode terminal and the cathode terminal in series, the connection point of the first resistor and the second resistor constitutes a reference voltage port of the reference voltage generation circuit for producing the reference voltage.

3. The analog to digital converter according to claim 2, wherein the integral circuit comprises an operational amplifier, a third resistor, and a capacitor; the operational amplifier comprises a first non-inverting input port, a first inverting input port, and a first output port for output the voltage enhanced gradually, the first non-inverting input port is connected to the reference voltage port, the first inverting input port is connected to the cathode terminal via the third resistor, the first inverting input port is also connected to the first output port via the capacitor.

4. The analog to digital converter according to claim 3, wherein the comparison circuit comprises a comparator, a fourth resistor, and a fifth resistor, the comparator comprises a second non-inverting input port, a second inverting input port, and a second output port; the fourth resistor and the fifth resistor are connected between the analog signal input port and the ground in series, the second non-inverting input port is connected to a connection port of the fourth resistor and the fifth resistor, the second inverting input port is connected to the first output port of the operational amplifier.

5. The analog to digital converter according to claim 4, wherein the controllable switch and the capacitor is connected in parallel between the first inverting input port and the first output port of the operational amplifier.

6. The analog to digital converter according to claim 5, wherein the controllable switch is a NMOSFET.

7. The analog to digital converter according to claim 5, wherein the controllable switch is a NPN BJT.

8. The analog to digital converter according to claim 5, wherein when the control unit outputs a high voltage on signal to turn on the controllable switch, the capacitor is discharged quickly via the turned on controllable switch, the voltage of the two ends of the capacitor are equal to each other, the integral circuit enters the ready state; when the control unit outputs a low voltage to turn off the controllable switch, there is current flows from the first inverting input port to the cathode terminal and charges the capacitor, then the voltage of the first output port and the second inverting input port are enhanced gradually.

* * * * *